(12) United States Patent
Paz

(10) Patent No.: US 6,269,470 B1
(45) Date of Patent: Jul. 31, 2001

(54) EFFICIENT ROUTING OF CONDUCTORS BETWEEN DATAPATHS

(75) Inventor: John Paz, Mountain View, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/321,479

(22) Filed: May 27, 1999

(51) Int. Cl.[7] .................................................. G06F 7/38
(52) U.S. Cl. .................... 716/12; 716/2; 716/8; 716/9; 716/16; 326/38; 326/41
(58) Field of Search .................... 326/38, 41; 716/2, 716/8, 9, 12, 16

(56) References Cited

U.S. PATENT DOCUMENTS

| 5,850,348 | 12/1998 | Berman ..................................... 716/6 |
| 5,896,300 | 4/1999 | Raghavan et al. ....................... 716/10 |
| 6,163,475 | * 12/2000 | Proebsting .............................. 365/63 |
| 6,218,855 | * 4/2001 | Ghosh et al. ........................... 326/38 |

OTHER PUBLICATIONS

Hou, et al., "A hierarchical methodology to improve channel routing by pin permutation"; IEEE International Conference on Computer–Aided Design; 1991, pp. 440–443.*

Lin, et al., "Maximum alignment of interchangeable terminals"; IEEE Transactions on Computers; vol. 37 10, Oct. 1988; pp. 1166–1177.*

* cited by examiner

Primary Examiner—Matthew S. Smith
Assistant Examiner—Jibreel Speight
(74) Attorney, Agent, or Firm—Sierra Patent Group, Ltd.

(57) ABSTRACT

A method for routing conductive paths between a first datapaths and a second datapath in an integrated circuit is described. The method includes determining the degree of alignment between block one from the first datapath to block one from the second datapath, and determining the degree of alignment between block N from the first datapath to block N from the second datapath; Following the determination of the degree of alignment, the least aligned block pair to be routed is chosen from block one and block N. Next, a first horizontal track location to be used for routing the desired connection between said first datapath and said second datapath is chosen, and the corresponding conductive path is then routed using that track location. For each of the remaining unrouted block pairs, the next block pair to be routed is chosen to be the block pair immediately adjacent to the most recently routed block pair. It is then determined whether the desired conductive path may successfully be routed using a previously defined track location, and if so, using that location for the routing. If not, a new track location is defined and used to route the desired conductive path.

3 Claims, 4 Drawing Sheets

EFFICIENT ROUTING OF CONDUCTORS BETWEEN DATAPATHS

BACKGROUND OF THE INVENTION

1. Field of the Invention

The present invention relates to integrated circuit routing. More particularly, the present invention provides a method for routing conductors between datapaths which minimizes the number of tracks required to connect the datapaths.

2. The Background Art

Modem integrated circuit designs often include common blocks of circuitry which are organized so that each block operates on a single bit of data. A group of these blocks is called a datapath. It is typical to have several datapaths linked together in order to perform complex desired logical functions on binary data.

FIG. 1 is a diagram showing two datapaths which are to be connected.

Referring to FIG. 1, datapath 10 includes N blocks of functional circuitry. Each block of circuitry is identical for a given datapath, but each datapath is most often different from each other datapath. Datapath 12 also includes N blocks of functional circuitry which may be the same or different as the functional circuitry included in the blocks making up datapath 10.

It is typical that each block in one datapath is designed to couple to a corresponding block in a second datapath. For example, the outputs of blocks 14 and 16 of datapath 10 would be designed to be connected to the inputs of block 18 and 20 of datapath 12 respectively, proceeding in the same manner for all blocks in each datapath until the inputs of all blocks in the first datapath are coupled to the corresponding output in the respective blocks in the other datapath.

FIG. 2 illustrates portions of two datapaths coupled together using horizontal and vertical tracks.

Shown in FIG. 2 are portions of datapaths 30 and 32 coupled together using conductive paths 34, 36, 38, and 40. Each conductive path has two vertical portions called vertical tracks, and one horizontal track. Each dotted line 42a through 42h is a horizontal location which can hold a horizontal track portion of a one or more conductive paths.

Vertical portions of conductive paths are typically placed on layers of a multilayer integrated circuit different than those layers containing the horizontal portions of conductive paths. Thus, conductive paths 38 and 40 are electrically distinct.

Those of ordinary skill in the art are readily aware that the placement of conductive paths which connect blocks on different datapaths together are routed by software routines within a program typically called a router. A router typically is given the coordinates of the endpoints of a desired conductive path and then routes the metal layers which include the horizontal and vertical tracks so that the endpoints are connected.

In the prior art, conductive lines are routed somewhat randomly. That is, path 36 may or may not be routed prior to conductive paths 34 or 38. this randomness usually results in more horizontal track locations being required than are necessary to accomplish the routing of all conductive paths. Using more than the minimum number of tracks causes valuable space to be used which could otherwise be used for a different purpose.

It would therefore be beneficial to provide a systematic method for routing conductive paths between datapaths which is efficient and utilizes only the minimum number of horizontal track locations required.

SUMMARY OF THE INVENTION

A method for routing N conductive paths between a first datapath and a second datapath in an integrated circuit is described. The method includes determining the degree of alignment between block one from the first datapath to block one from the second datapath, and determining the degree of alignment between block N from the first datapath to block N from the second datapath. Following the determination of the degree of alignment, the least aligned block pair to be routed is chosen from block one and block N. Next, a first horizontal track location to be used for routing the desired connection between said first datapath and said second datapath is chosen, and the corresponding conductive path is then routed using that track location. For each of the remaining unrouted block pairs, the next block pair to be routed is chosen to be the unrouted block pair immediately adjacent to the most recently routed block pair. It is then determined whether the desired conductive path may successfully be routed using a previously defined track location, and if so, using that location for the routing. If not, a new track location is defined and used to route the desired conductive path.

DETAILED DESCRIPTION OF ONE EMBODIMENT

Those of ordinary skill in the art will realize that the following description of the present invention is illustrative only and not in any way limiting. Other embodiments of the invention will readily suggest themselves to such skilled persons having the benefit of this disclosure.

The present invention provides a method for choosing the next conductive path to be routed so that the minimum number of track locations is required, thus ensuring that the minimum amount of valuable space is used to make the required connections.

Figure 1:
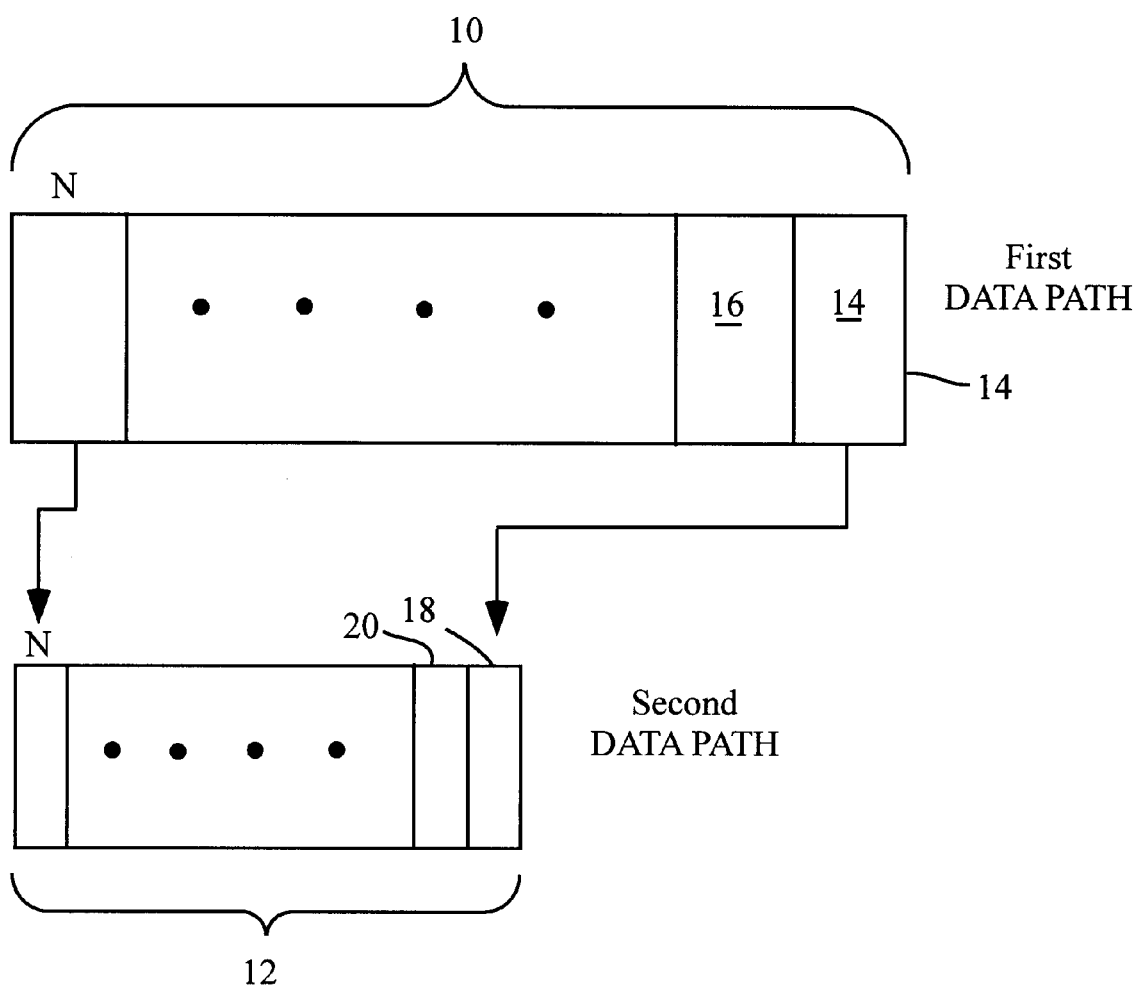
FIG. 1 is a diagram showing two datapaths which are to be connected.
Figure 2:
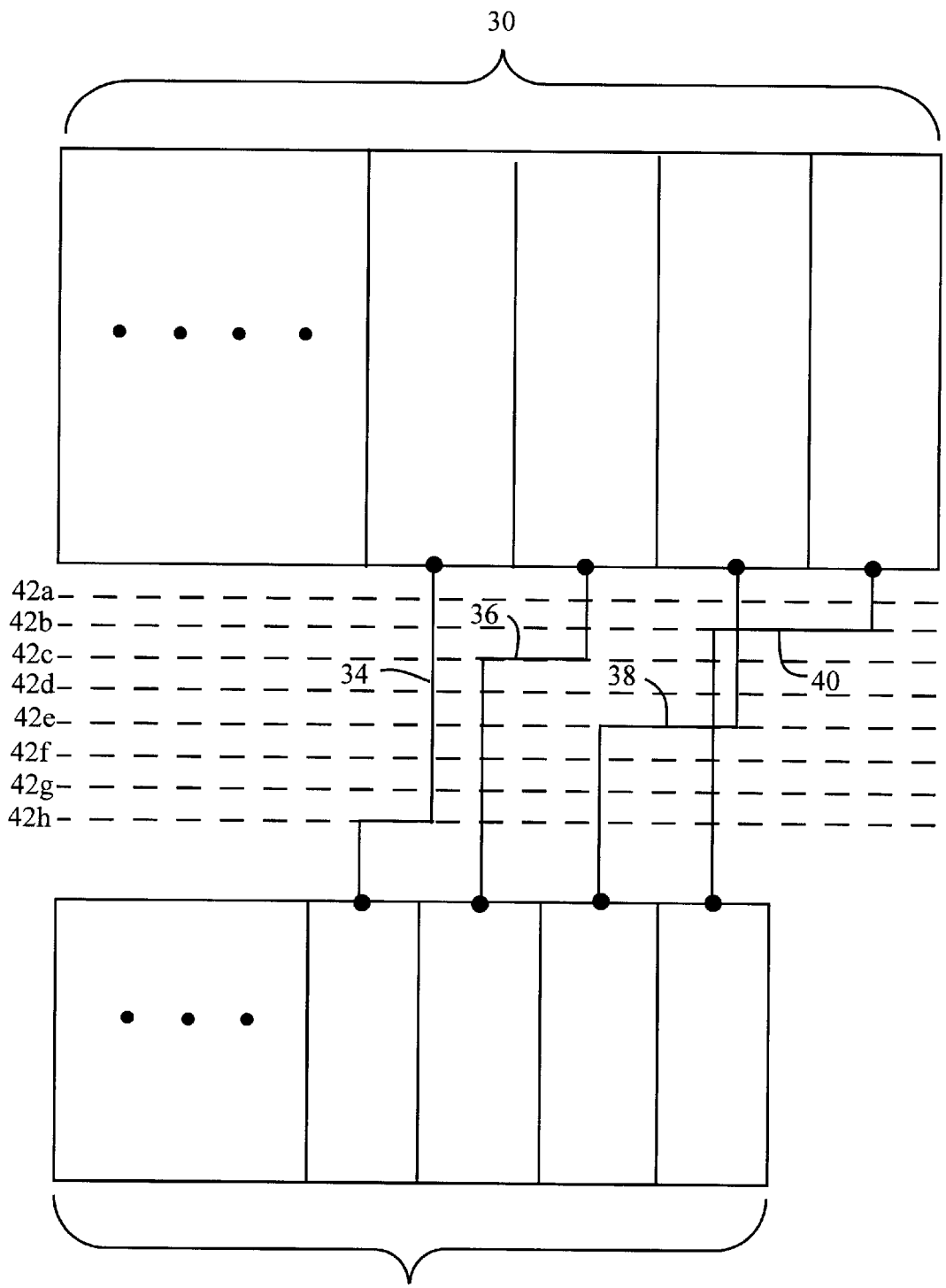
FIG. 2 illustrates portions of this coupled together using horizontal and vertical tracks.
Figure 3:
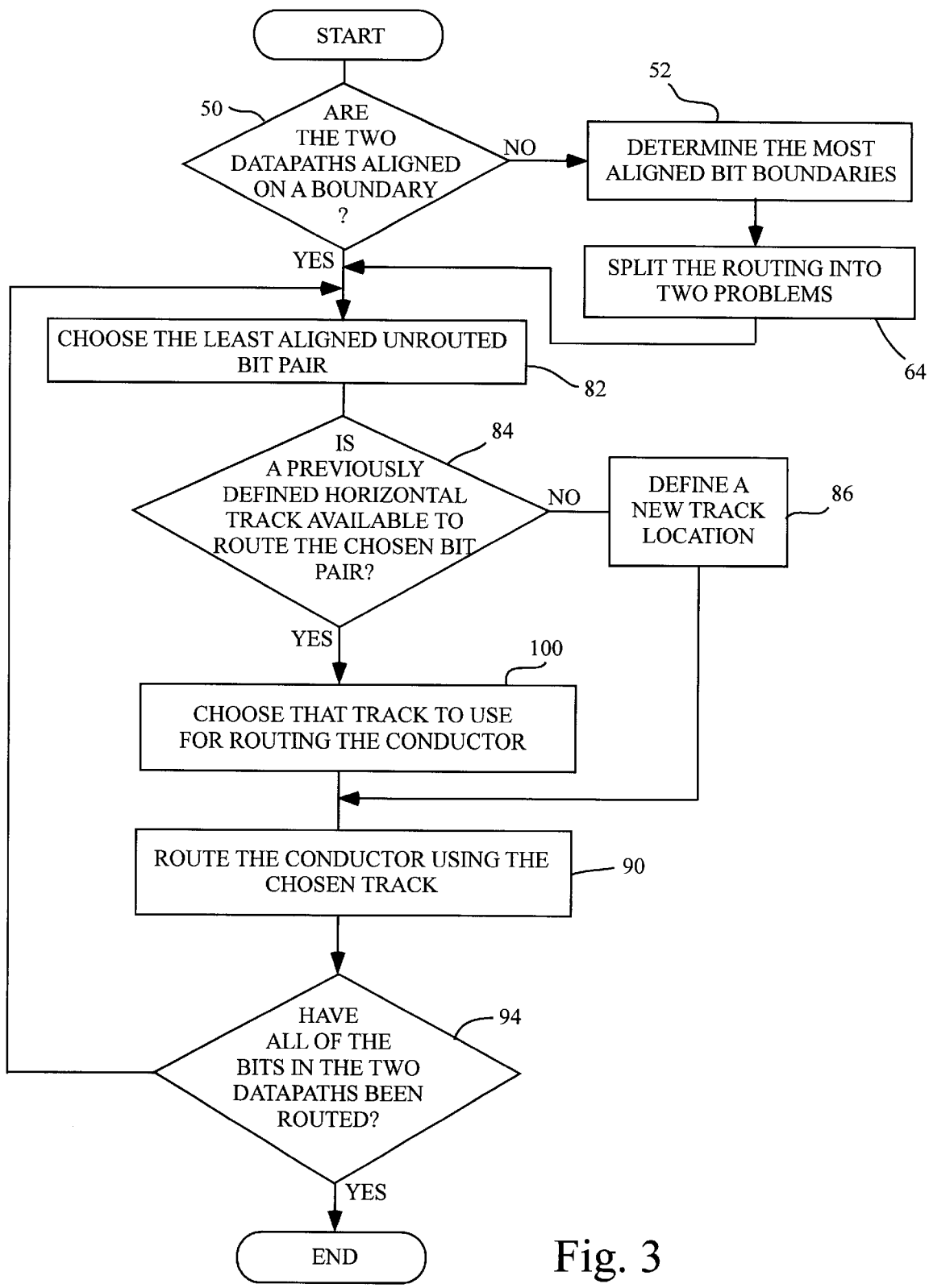
FIG. 3 is a flow chart describing steps in a method of the present invention.

FIG. 3 is a flow chart describing steps in a method of the present invention.

Referring to FIG. 3, the method begins at decision point 50 wherein it is determined if the two datapaths are aligned either on the right side or the left side of each datapath. If not, the single routing problem is broken into two routing problems, each of which can easily be solved by the method described herein.

Figure 4:
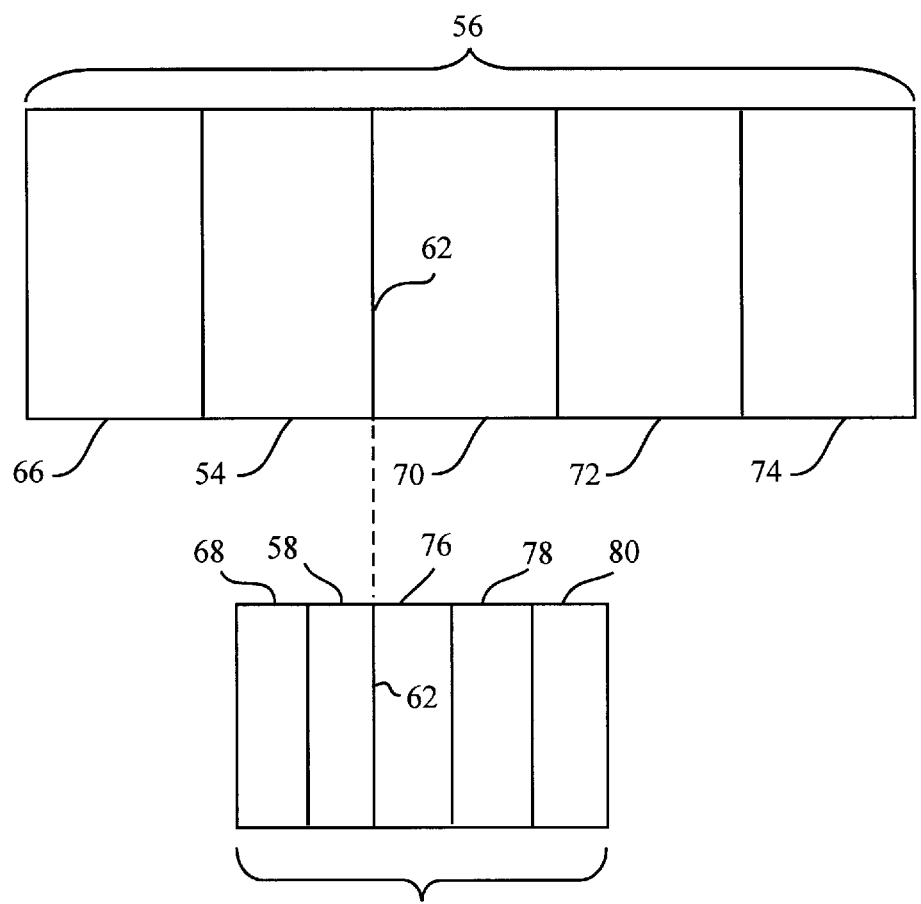
FIG. 4 shows two misaligned datapaths to be connected.

To split the single routing problem into two more easily solved routing segments, it is necessary, in box 52, that the most aligned block boundary between the two datapaths be identified. In the example of FIG. 4 the right boundary of block 54 of datapath 56 is most aligned with the right boundary of block 58 of datapath 60. It is important that not just any aligned boundaries be chosen. Rather, the boundary on the first datapath must correspond with the same boundary on the second datapath. In the example of FIG. 4, the right boundary for the second block from the left for each datapath is most aligned.

An example of an incorrect choice for an aligned boundary would result if the left boundary for the second block from the left of the upper datapath had been aligned with the right boundary for the third block from the left in the lower datapath and that pair was chosen. This choice is bad because if this alignment is chosen and the problem split into two parts on those boundaries, there would not be a one-to-one correspondence between the number of blocks left in each of the two problems after the split.

Using the example of FIG. 4, the most aligned boundary is boundary 62. Splitting the problem into two pieces at box 64 of FIG. 3 provides two routing problems, the first including blocks 54 and 66 of datapath 56 and blocks 58 and 68 of datapath 60, the second including blocks 70, 72 and 74 of datapath 56, and blocks 76, 78 and 80 of datapath 60.

Figure 5:
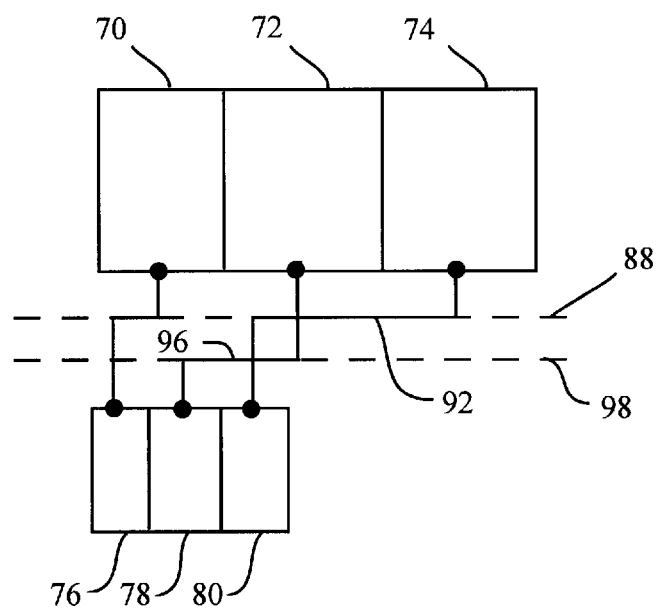
FIG. 5 shows the blocks in each datapath of FIG. 4 remaining after the routing problem is split.

FIG. 5 represents the blocks included in the second routing problem. The FIG. 5 example will be used to illustrate the remaining steps in the method of the present invention.

Following the initial problem being divided into two segments, or in the event that, at decision point 50, the datapaths were aligned on the right or left boundaries of both datapaths, the method proceeds with box 82 of FIG. 3 where the least aligned unrouted bit pair is chosen. In this example of FIG. 5, there are no previously routed bit pairs at this time. Further, the aligned edges are the left edge of block 70 and block 76. Since the least aligned edges pertain to blocks 74 and 80, blocks 74 and 80 are chosen for routing at this time.

At decision point 84, it is determined if there are previously defined track locations containing previously routed tracks available for use to route the chosen bit pair. Since there are no previously routed bit pairs, there are no previously routed horizontal track locations for use. Therefore, the method proceeds at box 86 where a horizontal track is defined for use. Track location 88 of FIG. 5 is the track defined at this point in this example.

At box 90 (FIG. 3), conductive path 92 is routed between blocks 74 and 80 (FIG. 5) using the constraint that track 88 must be used. At decision point 94 it is determined whether all of the datapath blocks in the present routing problem have been routed. In our example, the answer is no, and the method proceeds again at box 82 where blocks 72 and 78 are chosen for routing due to blocks 72 and 78 being the least aligned unrouted blocks. The method proceeds as described earlier, causing the routing of conductive path 96 using newly defined track location 98.

When blocks 70 and 76 are routed to complete the routing of all block pairs, it is determined at decision point 84 that a previously defined horizontal track location is suitable for routing the present block pair. The previously defined track location is suitable due to the proposed conductive path being routed between the present block pair not interfering with the previously routed conductive path 92. An interference would occur where a new conductive path would be forced to electrically connect to a previously defined conductive path.

At box 100, the previously defined horizontal track location is chosen for the routing of the current block pair, and the method proceeds as previously described at box 90.

If, at decision point 94, there are no remaining block pairs to be routed in the current problem, the method ends.

Those of ordinary skill in the art are aware the positioning of horizontal and vertical tracks is determined by various design rules applicable to the manufacturing process used to deposit the metal layers when forming an integrated circuit. It is contemplated by the inventors that this method apply to all sets of design rules, since the design rules define such criteria as how wide a metal line may be, and how far must a given line be from any other line, rather than defining the order of routing certain lines.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for routing conductive paths between a first datapath and a second datapath in an integrated circuit, the first and second datapaths each comprising the same number of blocks of functional circuitry, the blocks being numbered 1 (one) through N, the method comprising:

determining the degree of alignment between block one from the first datapath to block one from the second datapath;

determining the degree of alignment between block N from the first datapath to block N from the second datapath;

choosing the least aligned block pair to be routed from the following group: block one, block N;

defining a first horizontal track location to be used for routing the desired connection between said first datapath and said second datapath;

routing the conductive path between the respective ones of said least aligned block pairs;

for each of the remaining unrouted block pairs:
    determining the next block pair to be routed to be the block pair immediately adjacent to the most recently routed block pair;
    determining whether the desired conductive path may successfully be routed using a previously defined track location;
    routing, if a previously defined track location may be used, the desired conductive path between the blocks in the current block pair;
    defining, if no previously defined track location may be used, a new track location; and
    routing the desired conductive path between the blocks in the current block pair using said new track location defined in said defining step.

2. The method of claim 1 further comprising:

determining whether said first datapath is aligned with said second datapath on either of its boundaries chosen from the following group block one, block N;

splitting a routing problem that is discovered between said first datapath and second datapath into two distinct routing subproblems to be solved separately if said first datapath is not aligned with said second data path according to said determining step.

3. The method of claim 2 further wherein said splitting step further comprises:

determining the block boundary in said first datapath which is most aligned with the corresponding block boundary in said second datapath;

splitting the routing problem into two subproblems, the first independent problem having all blocks from each datapath on the right side of the most aligned boundary, the second independent problem having all blocks from each datapath on the right side of the most aligned boundary.

* * * * *